United States Patent
Nakazawa

(10) Patent No.: US 10,614,999 B2
(45) Date of Patent: Apr. 7, 2020

(54) IMAGE GENERATION METHOD

(71) Applicant: TASMIT, Inc., Yokohama (JP)

(72) Inventor: Shinichi Nakazawa, Yokohama (JP)

(73) Assignee: TASMIT, INC., Yokohama (JP)

( * ) Notice: Subject to any disclaimer, the term of this patent is extended or adjusted under 35 U.S.C. 154(b) by 0 days.

(21) Appl. No.: 16/116,700

(22) Filed: Aug. 29, 2018

(65) Prior Publication Data
US 2019/0066971 A1  Feb. 28, 2019

(30) Foreign Application Priority Data

Aug. 31, 2017  (JP) .................... 2017-166401

(51) Int. Cl.
*H01J 37/26* (2006.01)
*G06T 5/50* (2006.01)
*G01B 11/27* (2006.01)
*H01J 37/28* (2006.01)
*G01B 21/04* (2006.01)

(52) U.S. Cl.
CPC .......... *H01J 37/263* (2013.01); *G01B 11/272* (2013.01); *G01B 21/045* (2013.01); *G06T 5/50* (2013.01); *H01J 37/28* (2013.01); *H01J 2237/221* (2013.01); *H01J 2237/2809* (2013.01); *H01J 2237/2817* (2013.01)

(58) Field of Classification Search
CPC .... H01J 37/263; H01J 37/28; H01J 2237/221; H01J 2237/2817; H01J 2237/2809; G01B 21/045; G01B 11/272; G06T 5/50
See application file for complete search history.

(56) References Cited

U.S. PATENT DOCUMENTS

| | | | |
|---|---|---|---|
| 6,587,581 B1 * | 7/2003 | Matsuyama | G01N 21/8851 250/305 |
| 2006/0245636 A1 * | 11/2006 | Kitamura | G06K 9/00 382/149 |
| 2008/0302962 A1 * | 12/2008 | Takahashi | G01N 23/225 250/310 |
| 2012/0189183 A1 * | 7/2012 | Xue | G06T 5/50 382/131 |
| 2013/0301954 A1 * | 11/2013 | Shirai | H01J 37/28 382/280 |
| 2017/0169992 A1 * | 6/2017 | Kobayashi | H01J 37/244 |

* cited by examiner

Primary Examiner — Nizar N Sivji
(74) Attorney, Agent, or Firm — Lathrop GPM LLP

(57) ABSTRACT

A method which can generate a clear image of a specimen by correcting an image drift is disclosed. The image generation method includes: scanning a specimen with an electron beam to generate images; calculating amounts of image drift within specific regions of the respective images; calculating continuous amounts of image drift by interpolation from the amounts of image drift; determining an amount of image drift at each pixel of the images from the continuous amounts of image drift; correcting the images by correcting a brightness of each pixel based on the amount of image drift at each pixel; and generating a synthetic image from the corrected images.

2 Claims, 8 Drawing Sheets

→ First scan
---→ Second scan

IMAGE GENERATION METHOD

CROSS REFERENCE TO RELATED APPLICATION

This document claims priority to Japanese Patent Application No. 2017-166401 filed Aug. 31, 2017, the entire contents of which are hereby incorporated by reference.

BACKGROUND

There is a defect detection method using an electron image generated by a scanning electron microscope for pattern inspection of a wafer in a manufacturing process of a semiconductor integrated circuit or for pattern inspection of a photomask for forming the pattern.

In a method using an electron image generated by a scanning electron microscope, a specimen is two-dimensionally irradiated with an electron beam, and secondary electrons or backscattered electrons are detected to create a two-dimensional image. In order to increase an S/N ratio of the obtained image, the specimen is scanned with an electron beam multiple times, and a plurality of detection signals obtained from the same position are averaged.

A dielectric material, such as resist, oxide film, or the like, is used in a semiconductor integrated circuit which is an example of a specimen. In addition, in order to achieve high throughput inspection, a specimen may be irradiated with a large current electron beam. For these reasons, the specimen is charged and as a result, the electron beam is directed to a position different from a target position. If such a phenomenon occurs, an electron-beam irradiating position in each scan changes while the specimen is scanned with the electron beam multiple times. In this specification, this phenomenon is referred to as image drift. When the image drift occurs, a clear image cannot be obtained by the averaging process described above.

FIGS. 10A to 10C are diagrams showing an example of a phenomenon in which an image becomes unclear due to the image drift. More specifically, FIG. 10A is a schematic diagram showing a manner in which the electron beam scans a surface of a specimen 210 twice. The specimen 210 includes a pattern 200 formed thereon. As shown in FIG. 10A, the electron-beam irradiating positions in the second scan are slightly shifted from those in the first scan. This is because, as described above, the dielectric material forming the surface of the specimen is charged by the electron beam irradiation in the first scan.

FIG. 10B is a schematic diagram showing a pattern image 201 obtained by the first scan and a pattern image 202 obtained by the second scan. As can be seen from FIG. 10B, the position of the pattern image 202 is slightly shifted from the pattern image 201. FIG. 10C is a schematic diagram showing an average image 203 obtained by averaging the two pattern images 201, 202 shown in FIG. 10B. As a result of the positional shift between the pattern images 201, 202, the obtained average image 203 becomes unclear.

SUMMARY OF THE INVENTION

According to an embodiment, there is provided a method which can generate a clear image of a specimen by correcting an image drift.

Embodiments, which will be described below, relate to a method of generating an image of a dielectric material forming a surface of a specimen, such as a wafer or a glass substrate, with use of a scanning electron microscope, and more particularly, to a method of correcting an image drift caused by a charged dielectric material. The embodiments which will be described below can be applied to a pattern inspection apparatus for inspecting fine patterns of semiconductor integrated circuits (LSI) and liquid crystal panels and their photomask (reticle) manufactured based on design data.

In an embodiment, there is provided an image generation method comprising: scanning a specimen with an electron beam to generate images; calculating amounts of image drift within specific regions of the respective images; calculating continuous amounts of image drift by interpolation from the amounts of image drift; determining an amount of image drift at each pixel of the images from the continuous amounts of image drift; correcting the images by correcting a brightness of each pixel based on the amount of image drift at each pixel; and generating a synthetic image from the corrected images.

In an embodiment, the synthetic image is an average image of the corrected images.

In an embodiment, correcting the images comprises correcting the images by: adding the amount of image drift at each pixel to a position of each pixel to determine a shift position; obtaining a brightness of a pixel at the shift position; and assigning the obtained brightness to a brightness of the pixel at the position to which the amount of image drift is to be added.

According to the above-described embodiments, the image drift is corrected by estimating the amount of image drift in the electron beam scanning operation from the shift between a plurality of images. As a result, a clear image can be obtained even in a case of using a specimen which may cause the image drift.

DESCRIPTION OF EMBODIMENTS

Hereinafter, embodiments will be described in detail with reference to the drawings.

Figure 1:
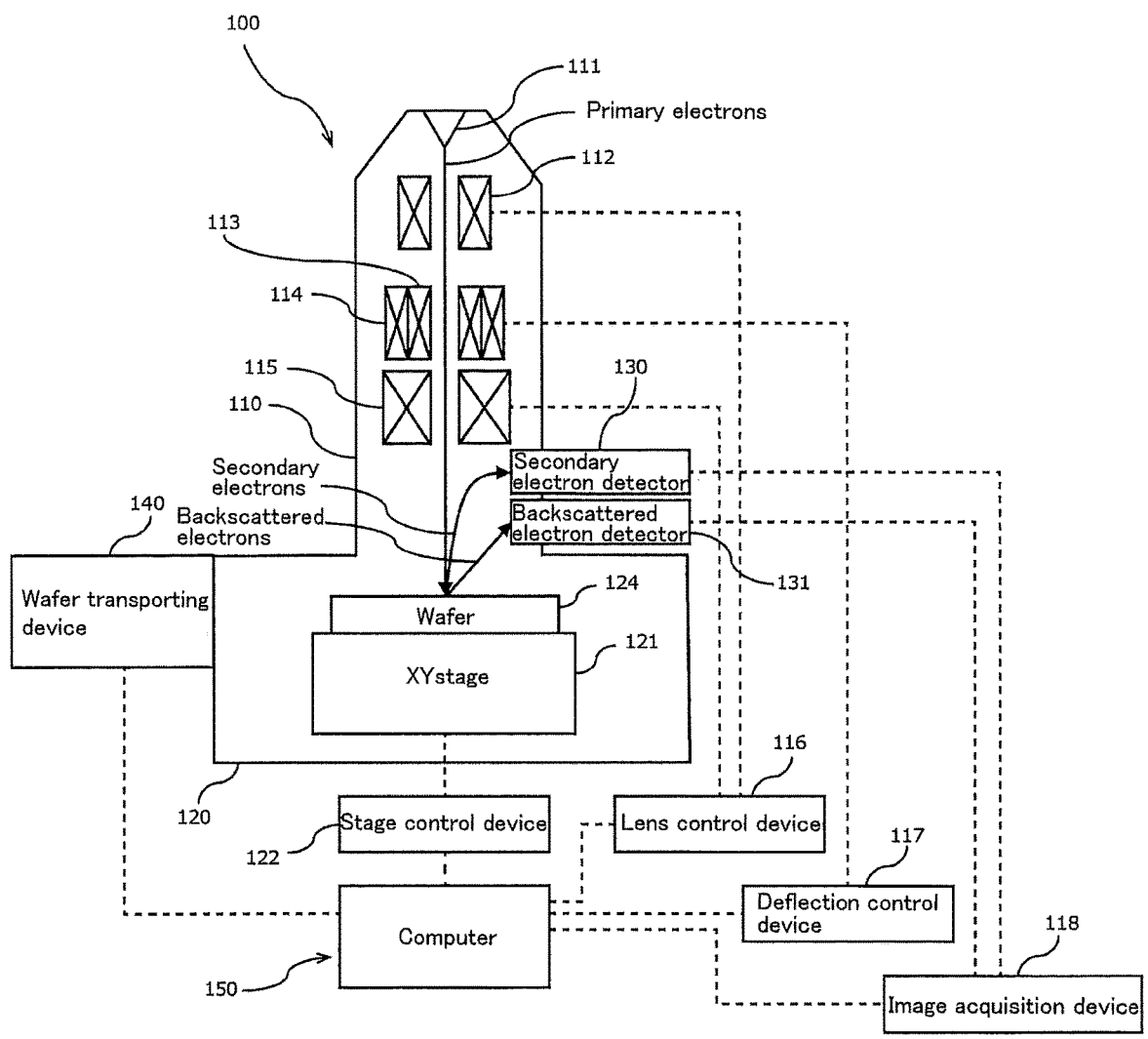
FIG. 1 is a schematic diagram showing an embodiment of an image generation system including a scanning electron microscope.

FIG. 1 is a schematic diagram showing an embodiment of an image generation system including a scanning electron microscope. As shown in FIG. 1, the image generation system includes a scanning electron microscope 100 and a computer 150 for controlling operations of the scanning electron microscope. The scanning electron microscope 100 includes an electron gun 111 that emits an electron beam composed of primary electrons (charged particles), a converging lens 112 that converges the electron beam emitted from the electron gun 111, an X deflector 113 that deflects the electron beam in an X direction, a Y deflector 114 for deflecting the electron beam in a Y direction, and an objective lens 115 for focusing the electron beam on a wafer 124 which is a specimen.

The converging lens 112 and the objective lens 115 are coupled to a lens control device 116, and operations of the converging lens 112 and the objective lens 115 are controlled by the lens control device 116. This lens control device 116 is coupled to the computer 150. The X deflector 113 and the Y deflector 114 are coupled to a deflection control device 117, and deflection operations of the X deflector 113 and the Y deflector 114 are controlled by the deflection control device 117. This deflection control device 117 is also coupled to the computer 150. A secondary electron detector 130 and a backscattered electron detector 131 are coupled to an image acquisition device 118. This image acquisition device 118 is configured to convert output signals of the secondary electron detector 130 and the backscattered electron detector 131 into an image. This image acquisition device 118 is also coupled to the computer 150.

An XY stage 121 is disposed in a specimen chamber 120. This XY stage 121 is coupled to a stage control device 122, so that the position of the XY stage 121 is controlled by the stage control device 122. This stage control device 122 is coupled to the computer 150. A wafer transporting device 140 for placing the wafer 124 onto the XY stage 121 in the specimen chamber 120 is also coupled to the computer 150.

The electron beam emitted from the electron gun 111 is converged by the converging lens 112, and is then focused by the objective lens 115 onto the surface of the wafer 124, while the electron beam is deflected by the X deflector 113 and the Y deflector 114. When the wafer 124 is irradiated with the primary electrons of the electron beam, secondary electrons and backscattered electrons are emitted from the wafer 124. The secondary electrons are detected by the secondary electron detector 130, and the backscattered electrons are detected by the backscattered electron detector 131. The signals of the detected secondary electrons and the signals of the backscattered electrons are input into the image acquisition device 118, and are converted into an image. The image is transmitted to the computer 150.

Figure 2:
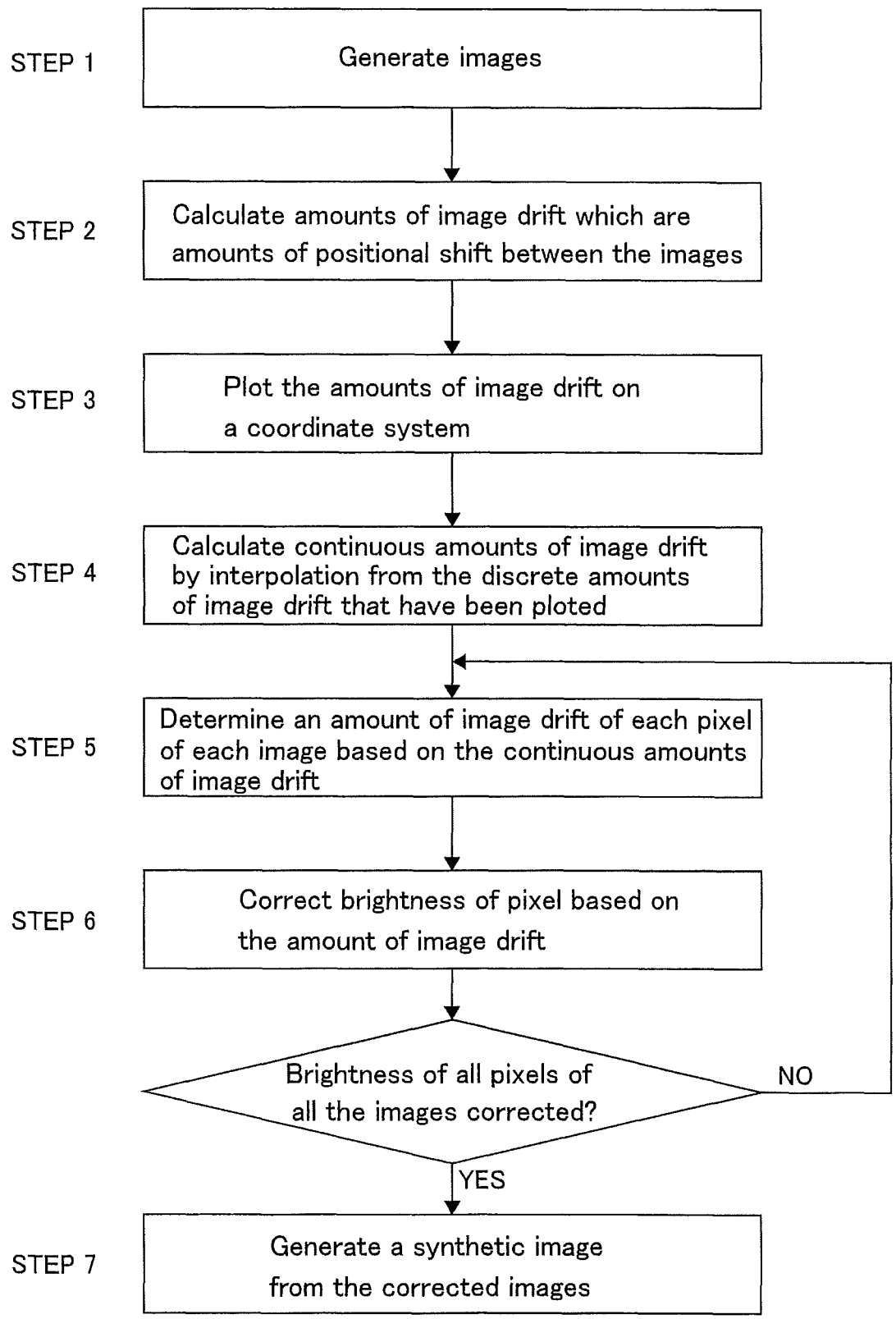
FIG. 2 is a flowchart showing an embodiment of an image drift correcting method.

FIG. 2 is a flowchart showing an embodiment of an image drift correcting method. The image drift correction is executed by the computer 150 shown in FIG. 1. In the present embodiment, the specimen is the wafer 124 having a surface constituted by a dielectric material. The scanning electron microscope 100 controls the X deflector 113 and the Y deflector 114 shown in FIG. 1 to scan the same place within the surface of the wafer 124 plural times, thereby generating a plurality of images of a pattern on the wafer 124 (step 1). The computer 150 obtains the plurality of images from the scanning electron microscope 100.

Next, the computer 150 calculates amounts of positional shift between the images, i.e., amounts of image drift within specific regions of the images (step 2). In addition, the computer 150 calculates times when the electron beam has scanned the specific regions of the images. The specific regions are regions defined in the images, respectively. In this embodiment, the specific regions include images of a pattern. The specific regions are located at the same position over the plurality of images.

The computer 150 plots the amounts of image drift calculated in the step 2 on a coordinate system having coordinate axes representing time and amount of image drift (step 3). Further, the computer 150 calculates continuous amounts of image drift by interpolation from the discrete amounts of image drift plotted in the step 3 (step 4). Next, the computer 150 determines an amount of image drift of each pixel of the plurality of images based on the continuous amounts of image drift obtained in the step 4 (step 5). The computer 150 corrects the plurality of images by correcting the brightness of each pixel based on the amount of image drift of each pixel (step 6). Finally, the computer 150 generates a synthetic image from the plurality of corrected images (step 7).

Figure 3:
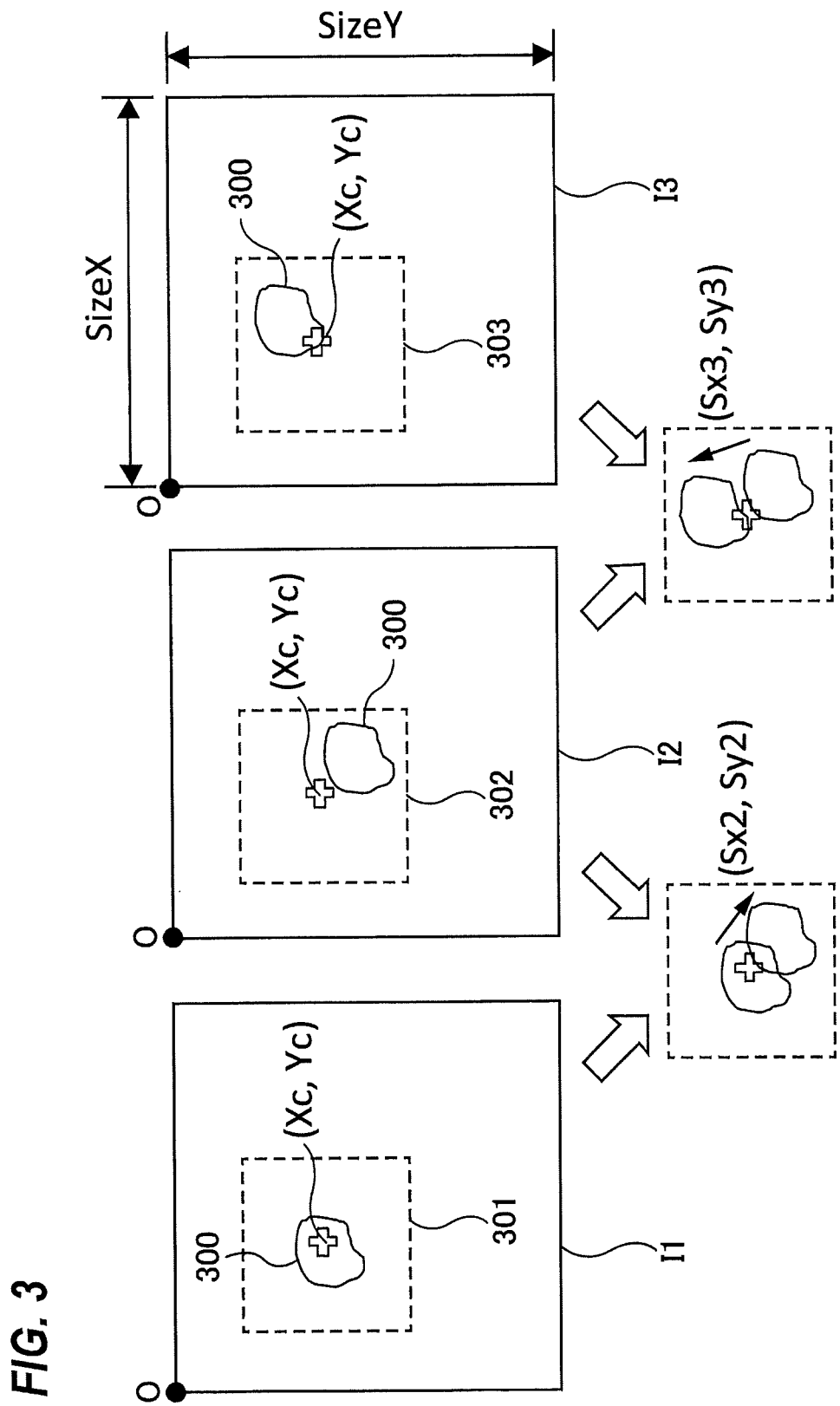
FIG. 3 is a conceptual diagram of step 2 in the flowchart shown in FIG. 2.

FIG. 3 is a conceptual diagram of the step 2 of FIG. 2. The scanning electron microscope 100 scans the surface of the specimen with the electron beam plural times to generate a plurality of images I1, I2, I3 of a pattern 300 which may be an interconnect trench or a contact hole. The computer 150 obtains these images I1, I2, I3 from the scanning electron microscope 100. The computer 150 sets a specific region 301 in the image I1 that has been generated by the first scan. This specific region 301 is used for alignment between the images. The specific region 301 includes the pattern 300. As a method of determining the position of the specific region 301, it is possible to use a method of applying a Laplacian filter to the image I1 to emphasize the edge of the pattern 300 and selecting a region having a high edge density. The center position of the specific region 301 is defined as a reference point (Xc, Yc). This reference point (Xc, Yc) is a point on an XY coordinate system having an origin located on a scanning start position O.

Similarly, the computer 150 sets specific regions 302, 303 centered on the reference point (Xc, Yc) in the image I2 generated by the second scan and in the image I3 generated by the third scan. The specific regions 301, 302, 303 are located at the same position over the plurality of images I1, I2, I3. The computer 150 aligns the pattern 300 in the specific region 301 of the image I1 with the pattern 300 in the specific region 302 of the image I2. More specifically, the pattern 300 in the specific region 301 is moved until the pattern 300 in the specific region 301 matches the pattern 300 in the specific region 302. A cross-correlation method can be used for the alignment of the patterns 300 (i.e., the pattern matching).

The computer 150 calculates a movement distance of the pattern 300 necessary for the alignment, i.e., an amount of image drift (Sx2, Sy2) between the images I1, I2. The amount of image drift (Sx2, Sy2) is composed of an X-direction drift amount Sx2 which is an amount of image drift in a direction parallel to the scanning direction, and a Y-direction drift amount Sy2 which is an amount of image drift in a direction perpendicular to the scanning direction. Similarly, the computer 150 aligns the pattern 300 in the specific region 302 of the image I2 with the pattern 300 in the specific region 303 of the image I3, and calculates an amount of image drift (Sx3, Sy3) between the images I2, I3. The amount of image drift (Sx2, Sy2) is an amount of image drift at the center of the specific region 302 in the second scan, and the amount of image drift (Sx3, Sy3) is the amount of image drift at the center of the specific region 303 in the third scan.

SizeX represents the number of pixels in each image arranged in the direction parallel to the scanning direction, and SizeY represents the number of pixels in each image arranged in the direction perpendicular to the scanning direction. A scanning rate [pixel/sec] is defined as a speed at which the electron beam scans the surface of the specimen per unit time. A scanning period t1 necessary for generating one image is determined from (SizeX×SizeY)/the scanning rate. On the other hand, in each image, a scanning period t2 from the scanning start position O to the center (Xc, Yc) of the specific region is determined from (Xc+Yc×SizeX)/the scanning rate.

The computer 150 calculates the scanning period t1 and the scanning period t2, and calculates times when the electron beam has scanned the specific regions 301, 302, and 303 of the images I1, I2, and I3. In the present embodiment, the times when the electron beam has scanned the specific regions 301, 302, and 303 correspond to times when the electron beam has scanned the center (Xc, Yc) of the specific regions 301, 302, and 303. Specifically, the time when the electron beam has scanned the center (Xc, Yc) of the specific region 301 is t2, the time when the electron beam has scanned the center (Xc, Yc) of the specific region 302 is t1+t2, and the time when the electron beam has scanned the center (Xc, Yc) of the specific region 303 is t1×2+t2.

Figure 4:
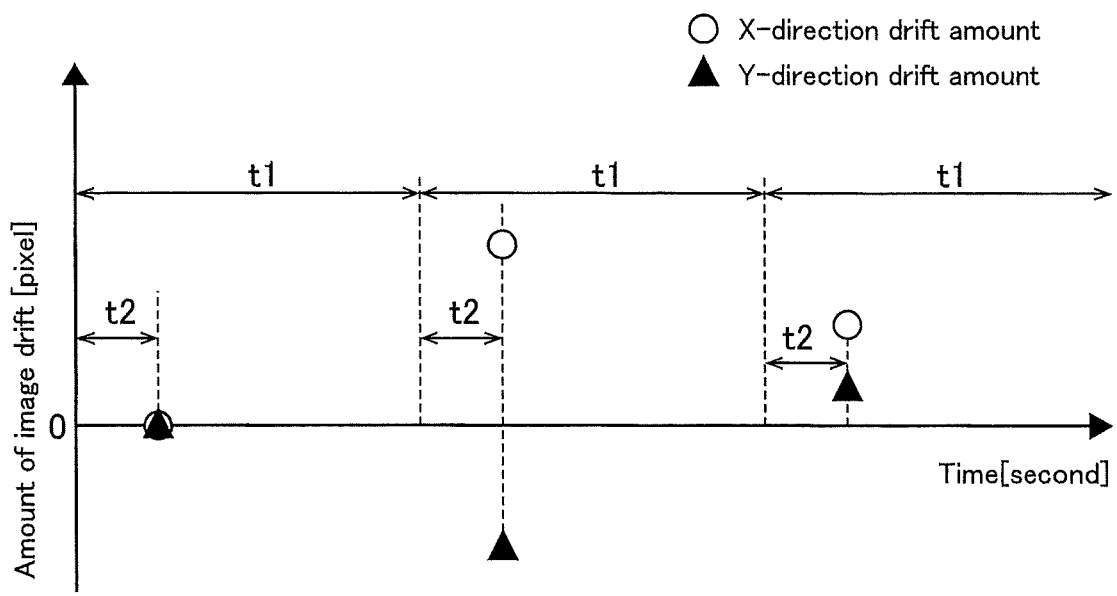
FIG. 4 is a conceptual diagram of step 3 in the flowchart shown in FIG. 2.

FIG. 4 is a conceptual diagram of the step 3 of FIG. 2. The amount of image drift (Sx2, Sy2) and the amount of image drift (Sx3, Sy3) determined in the step 2 are plotted on a coordinate system having coordinate axes representing time and amount of image drift. More specifically, the computer 150 resolves the amount of image drift (Sx2, Sy2) into the X-direction drift amount Sx2 and the Y-direction drift amount Sy2, and plots the X-direction drift amount Sx2 and the Y-direction drift amount Sy2 on positions at which the time t1+t2 has elapsed from a scanning start time 0. Similarly, the computer 150 resolves the amount of image drift (Sx3, Sy3) into the X-direction drift amount Sx3 and the Y-direction drift amount Sy3, and plots the X-direction drift amount Sx3 and Y-direction drift amount Sy3 on positions at which the time t1×2+t2 has elapsed from the scanning start time 0.

Figure 5:
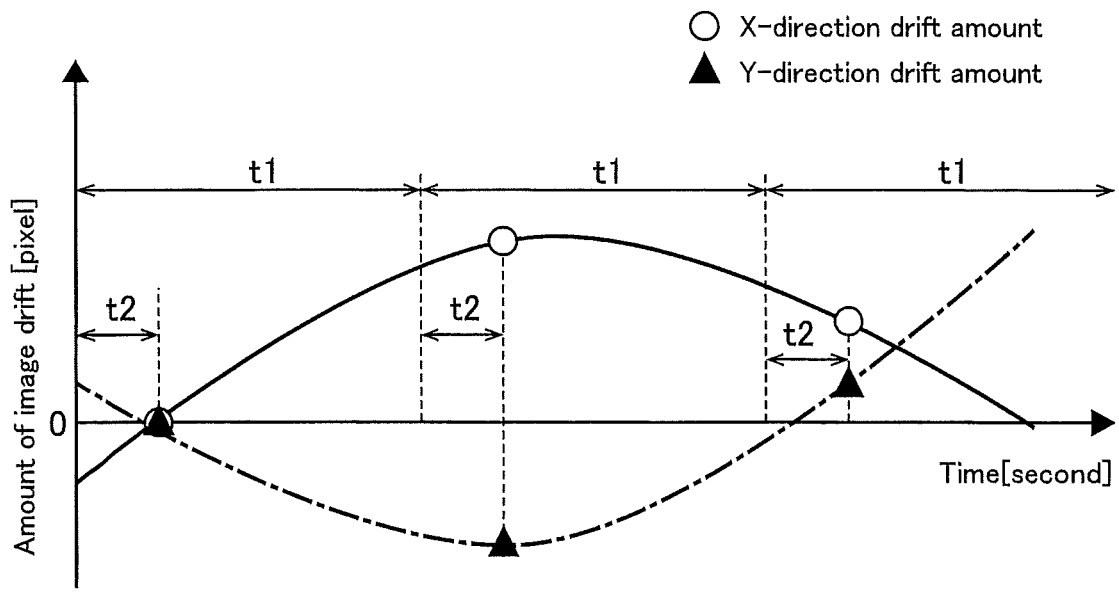
FIG. 5 is a conceptual diagram of step 4 in the flowchart shown in FIG. 2.

FIG. 5 is a conceptual diagram of the step 4 of FIG. 2. The computer 150 calculates continuous amounts of image drift by interpolation from the discrete amounts of image drift that have been plotted. Polynomial interpolation or cubic spline interpolation can be used for the interpolation.

Figure 6:
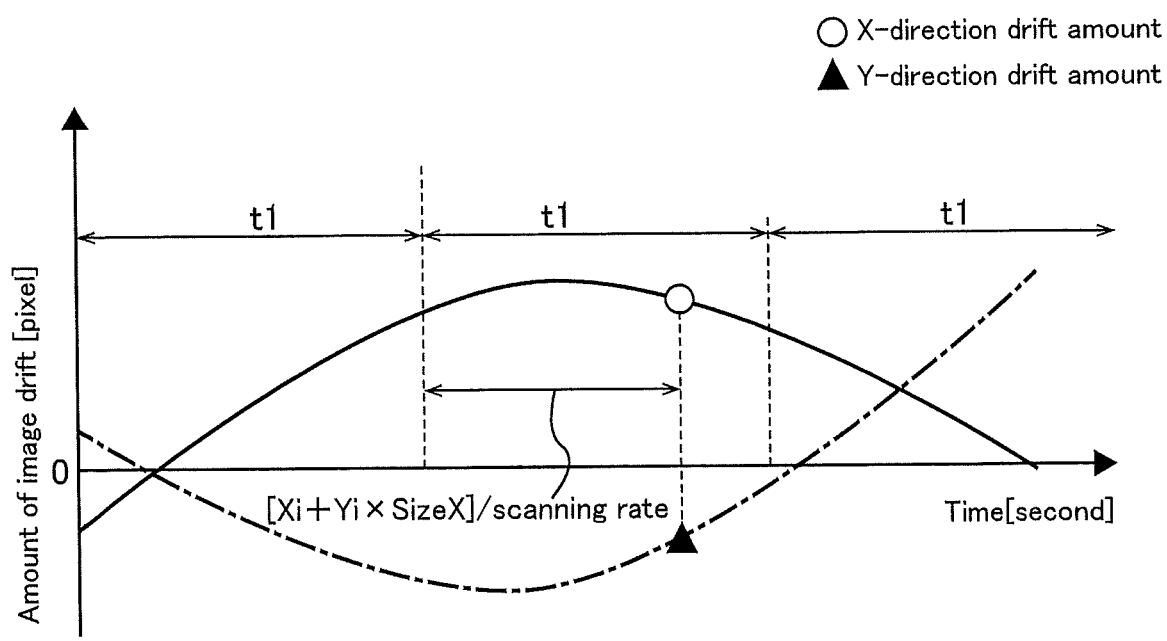
FIG. 6 is a conceptual diagram of step 5 in the flowchart shown in FIG. 2.

FIG. 6 is a conceptual diagram of the step 5 of FIG. 2. An amount of image drift in each pixel of each image is determined based on the continuous amounts of image drift obtained in the step 3. An amount of image drift (Sxi, Syi) at a position (Xi, Yi) of a pixel in an N-th image is an amount of image drift at a time when the time of t1×(N−1)+(Xi+Yi×SizeX)/the scanning rate has elapsed from the scanning start point 0.

Figure 7:
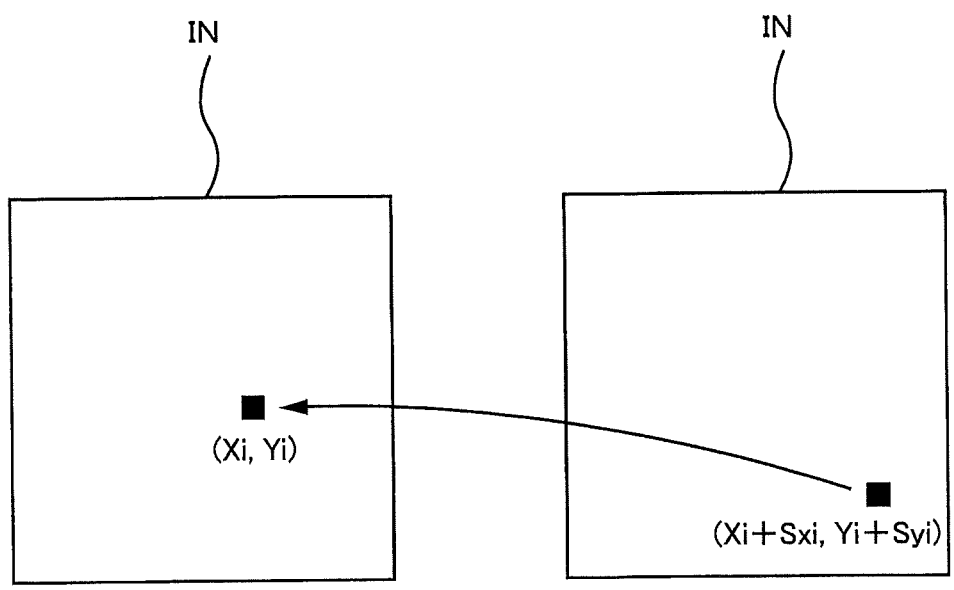
FIG. 7 is a conceptual diagram of step 6 in the flowchart shown in FIG. 2.

FIG. 7 is a conceptual diagram of the step 6 of FIG. 2. The computer 150 corrects a brightness of the pixel at the position (Xi, Yi) in the N-th image IN based on the amount of image drift (Sxi, Syi) determined in the step 5. More specifically, the computer 150 adds the amount of image drift (Sxi, Syi) to the position (Xi, Yi) of the pixel to determine a shift position (Xi+Sxi, Yi+Syi), and obtains a brightness of a pixel at the determined shift position (Xi+Sxi, Yi+Syi). The computer 150 assigns the obtained brightness to a brightness of the pixel at the original position (Xi, Yi). When Sxi and Syi are not integers, the brightness of the pixel is determined by interpolation of brightness at neighboring pixels.

The computer 150 performs the processes of the step 5 and the step 6 for all pixels of all the images I1, I2, I3 to generate corrected images of the images I1, I2, I3.

Figure 8:
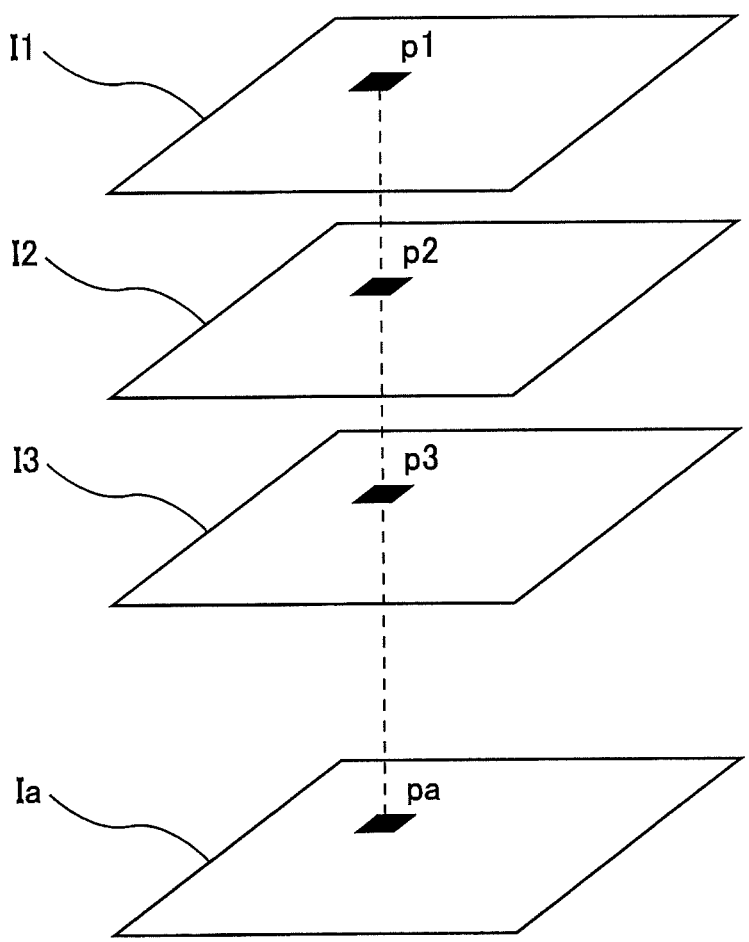
FIG. 8 is a conceptual diagram of step 7 in the flowchart shown in FIG. 2.

FIG. 8 is a conceptual diagram of the step 7 of FIG. 2. In the present embodiment, the computer 150 generates an average image, which is an example of a synthetic image, from the corrected images I1, I2, I3. More specifically, the computer 150 calculates an average pa of brightness values p1, p2, p3 of pixels at the same position in the corrected images I1, I2, I3, and assigns the average pa to a brightness of a pixel of an average image Ia. The computer 150 performs this averaging process for all pixels, thereby obtaining the average image Ia.

In one embodiment, a process other than the averaging process may be used to generate the synthetic image. For example, a synthetic image may be generated using a median of brightness values of respective pixels of the corrected images I1, I2, and I3. More specifically, the computer 150 determines a median of the brightness values p1, p2, p3 of the pixels at the same position in the corrected images I1, I2, I3, and assigns this median to a brightness of a pixel of the synthetic image Ia. The computer 150 performs this process for all pixels, thereby obtaining the synthetic image Ia.

Figure 9:
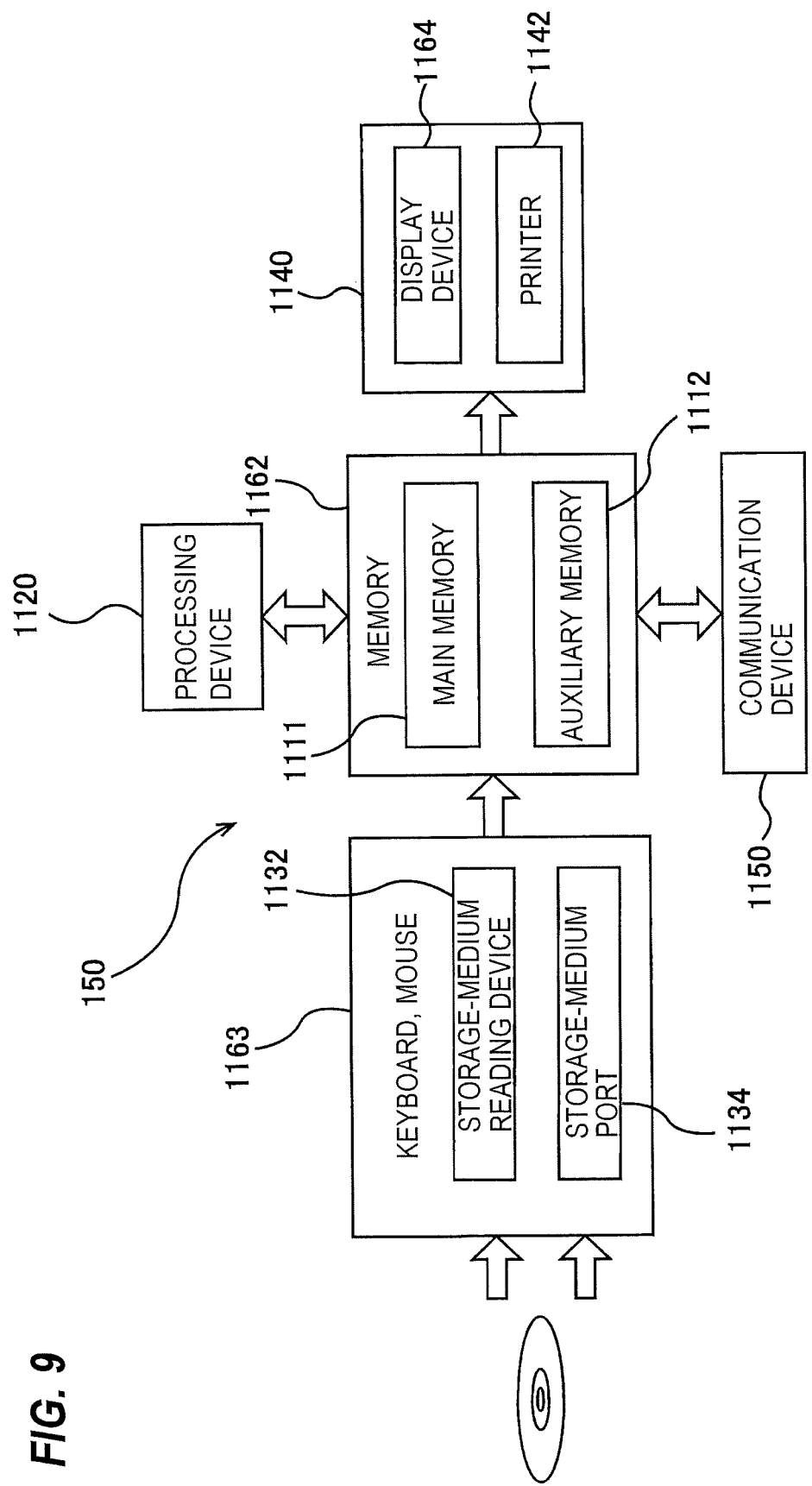
FIG. 9 is a schematic diagram showing a structure of a computer.
Figure 10A:
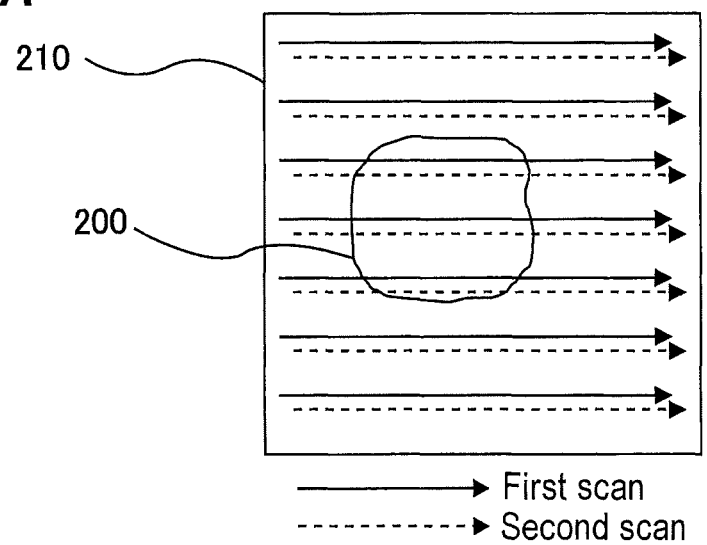
FIGS. 10A, 10B, and 10C are conceptual diagrams showing an example of an image drift.
Figure 10B:
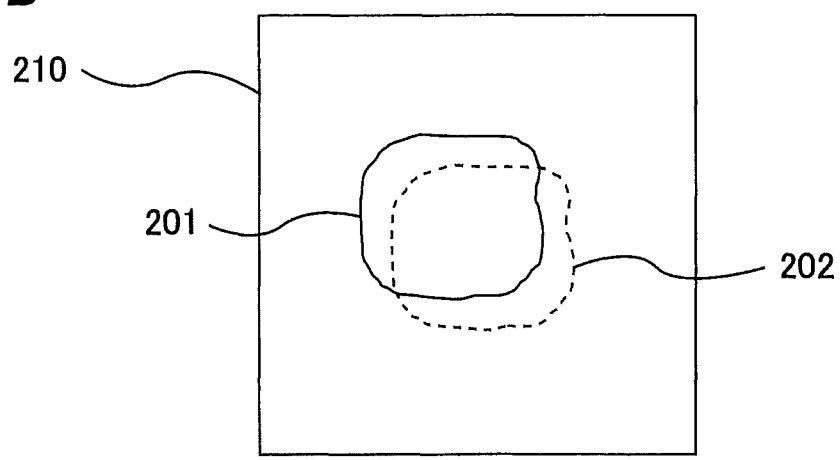
Figure 10C:
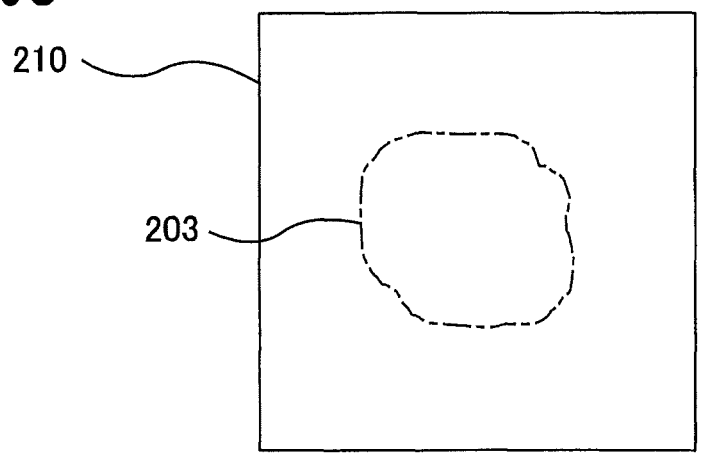

FIG. 9 is a schematic diagram showing the configuration of the computer 150. The computer 150 includes a memory 1162 in which a program and data are stored, a processing device 1120, such as CPU (central processing unit), for performing arithmetic operation according to the program stored in the memory 1162, an input device 1163 for inputting the data, the program, and various information into the memory 1162, an output device 1140 for outputting processing results and processed data, and a communication device 1150 for connecting to a network, such as the Internet.

The memory 1162 includes a main memory 1111 which is accessible by the processing device 1120, and an auxiliary memory 1112 that stores the data and the program therein. The main memory 1111 may be a random-access memory (RAM), and the auxiliary memory 1112 is a storage device which may be a hard disk drive (HDD) or a solid-state drive (SSD).

The input device 1163 includes a keyboard and a mouse, and further includes a storage-medium reading device 1132 for reading the data from a storage medium, and a storage-medium port 1134 to which a storage medium can be connected. The storage medium is a non-transitory tangible computer-readable storage medium. Examples of the storage medium include optical disk (e.g., CD-ROM, DVD-ROM) and semiconductor memory (e.g., USB flash drive, memory card). Examples of the storage-medium reading device 1132 include optical drive (e.g., CD drive, DVD drive) and card reader. Examples of the storage-medium port 1134 include USB terminal. The program and/or the data stored in the storage medium is introduced into the computer 150 via the input device 1163, and is stored in the auxiliary memory 1112 of the memory 1162. The output device 1140 includes a display device 1164 and a printer 1142.

The above description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:
1. An image generation method comprising:
scanning a specimen with an electron beam to generate images;

calculating amounts of image drift within specific regions of the respective images;
calculating continuous amounts of image drift by interpolation from the amounts of image drift;
determining an amount of image drift at each pixel of the images from the continuous amounts of image drift;
correcting the images by correcting a brightness of each pixel based on the amount of image drift at each pixel; and
generating a synthetic image from the corrected images;
wherein correcting the images comprises correcting the images by:
adding the amount of image drift at each pixel to a position of each pixel to determine a shift position;
obtaining a brightness of a pixel at the shift position; and
assigning the obtained brightness to a brightness of the pixel at the position to which the amount of image drift is to be added.

2. The image generation method according to claim 1, wherein the synthetic image is an average image of the corrected images.

* * * * *